(12) United States Patent
Nakanishi et al.

(10) Patent No.: US 7,495,295 B2
(45) Date of Patent: Feb. 24, 2009

(54) SEMICONDUCTOR DEVICE AND METHOD FOR FABRICATING THE SAME

(75) Inventors: Kentaro Nakanishi, Toyama (JP); Isao Miyanaga, Nara (JP); Atsuhiro Kajiya, Hyogo (JP)

(73) Assignee: Panasonic Corporation, Osaka (JP)

( * ) Notice: Subject to any disclaimer, the term of this patent is extended or adjusted under 35 U.S.C. 154(b) by 195 days.

(21) Appl. No.: 11/258,931

(22) Filed: Oct. 27, 2005

(65) Prior Publication Data

US 2006/0170065 A1    Aug. 3, 2006

(30) Foreign Application Priority Data

Jan. 31, 2005    (JP) .............................. 2005-023279

(51) Int. Cl.
*H01L 29/72* (2006.01)
(52) U.S. Cl. .................. 257/391; 257/288; 257/368; 257/392; 257/401; 257/408
(58) Field of Classification Search .................. 257/288, 257/368, 391, 392, 401, 408
See application file for complete search history.

(56) References Cited

FOREIGN PATENT DOCUMENTS

JP    2001-024168    *    1/2001

* cited by examiner

*Primary Examiner*—Edward Wojciechowicz
(74) *Attorney, Agent, or Firm*—McDermott Will & Emery LLP (57) ABSTRACT

In a semiconductor device according to the present invention, the power source voltage Vdd1 of a core transistor Tr1, the power source voltage Vdd2 of an I/O transistor Tr2, and the power source voltage Vdd3 of an I/O transistor Tr3 satisfy Vdd1<Vdd2<Vdd3. In a method for fabricating the semiconductor device, each of the respective gate insulating films of the I/O transistors Tr2 and Tr3 is formed in the same step to have the same thickness. Each of the respective SD extension regions of the core transistor Tr1 and the I/O transistor Tr2 is formed at the same dose.

5 Claims, 6 Drawing Sheets

FIG. 1

$Vdd1 < Vdd2 < Vdd3$
$Tox1 < Tox2 = Tox3$
$xj1 \fallingdotseq xj2 < xj3$
$N1 \fallingdotseq N2 > N3$

| | |
|---|---|
| Vdd1, 2, 3 | : Power Source Voltages |
| Tox1, 2, 3 | : Thicknesses of Gate Insulating Films |
| Xj1, 2, 3 | : Junction Depths of Impurity Diffusion Layers |
| N1, 2, 3 | : Peak Concentrations of Impurity Diffusion Layers |

Vdd1 < Vdd2 < Vdd3
Tox1 < Tox2 < Tox3
xj1 < xj2 < xj3
N1 > N2 > N3

| | |
|---|---|
| Vdd1, 2, 3 | : Power Source Voltages |
| Tox1, 2, 3 | : Thicknesses of Gate Insulating Films |
| Xj1, 2, 3 | : Junction Depths of Impurity Diffusion Layers |
| N1, 2, 3 | : Peak Concentrations of Impurity Diffusion Layers |

SEMICONDUCTOR DEVICE AND METHOD FOR FABRICATING THE SAME

BACKGROUND OF THE INVENTION

The present invention relates to a semiconductor device comprising a transistor composing a logic circuit and transistors composing input/output circuits and to a method for fabricating the same.

In a semiconductor device comprising a transistor (hereinafter referred to as a core transistor) composing a logic circuit and transistors (hereinafter referred to as I/O transistors) composing input/output circuits, the individual transistors typically has different power source voltages corresponding thereto, respective gate insulating films with different thicknesses, different impurity profiles, and the like.

Since the core transistor is required to achieve both low power consumption and high-speed operation, the power source voltage thereof is set lower than that of each of the I/O transistors and the gate insulating film thereof is formed to be thinner than that of the I/O transistor. On the other hand, both of the core transistor and the I/O transistors have identically configured source/drain regions. In each of the I/O transistors, lightly doped diffusion layers termed LDD regions are formed in the portions of the source/drain regions which are interposed between the source and the drain. In the core transistor, heavily doped SD extension regions are formed to have shallow junctions. In general, a process which forms gate insulating films with two different thicknesses in a semiconductor device is termed a dual-oxide process.

In recent years, there have been cases where not only one type of I/O transistor but also two types of I/O transistors which achieve higher-speed operation and lower power consumption have been in demand. In such cases, it is necessary to set the power source voltage of a second-type I/O transistor to a value lower than that of a first-type I/O transistor and also form the gate insulating film of the second-type I/O transistor such that it is thinner than that of the first-type I/O transistor. This necessitates the introduction of a triple-oxide process for forming the core transistor and the two types of I/O transistors.

A method for optimizing the power source voltages and the thicknesses of the gate insulating films in such a triple-oxide process depending on the uses and applications of the transistors composing a semiconductor device is disclosed in, e.g., Japanese Laid-Open Patent Publication No. 2001-24168.

Figure 4:
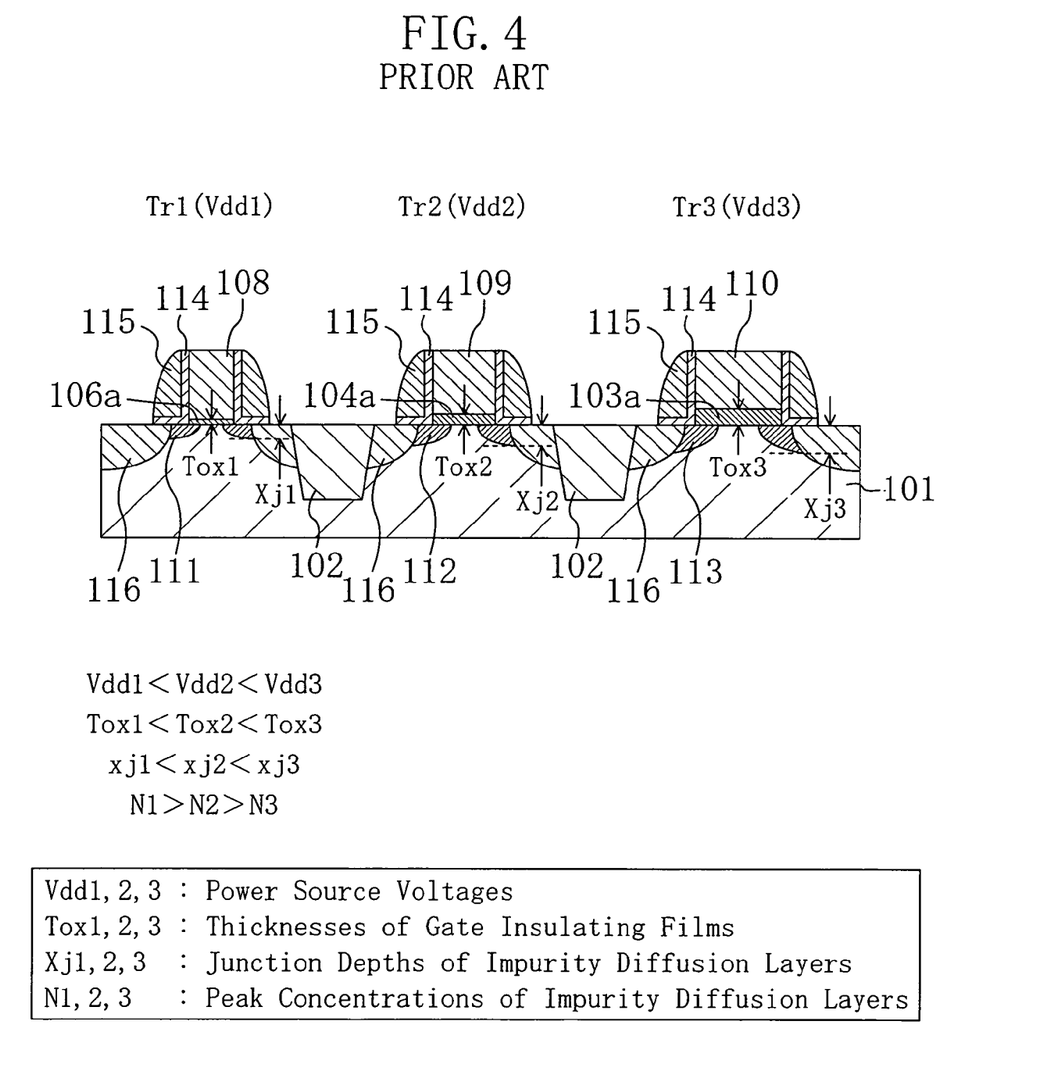
FIG. 4 is a cross-sectional view showing the structure of a conventional semiconductor device produced by using a triple-oxide process.

FIG. 4 is a cross-sectional view showing the structure of a conventional semiconductor device produced by using a triple-oxide process. As shown in FIG. 4, the conventional semiconductor device is provided with a core transistor Tr1 and two I/O transistors Tr2 and Tr3 which are different in type and power source voltage. The respective thicknesses Tox1, Tox2, and Tox3 of the gate insulating films 106a, 104a, and 103a in the individual transistors Tr1 to Tr3 satisfy Tox1<Tox2<Tox3. The junction depth Xj1 of each of the SD extension regions 111 of the core transistor Tr1 and the respective junction depths Xj2 and Xj3 of the LDD regions 112 and 113 of the I/O transistors Tr2 and Tr3 satisfy Xj1<Xj2<Xj3. The respective peak concentrations N1, N2, and N3 of the SD extension regions 111 and the LDD regions 112 and 113 satisfy N1>N2>N3.

FIGS. 5A to 5E and FIGS. 6A to 6D are cross-sectional views illustrating the steps of the triple-oxide process for forming the gate insulating films in the semiconductor device shown in FIG. 4. In accordance with the method, a silicon oxide film 103 with a thickness required for the gate insulating film of the I/O transistor Tr3 is formed first over the entire surface of a semiconductor substrate 101 in the step shown in FIG. 5A. Then, a resist mask 120 for forming openings corresponding to regions to be formed with the core transistor Tr1 and the I/O transistor Tr2 is formed. Subsequently, in the step shown in FIG. 5B, wet etching is performed to remove the portions of the silicon oxide film 103 which are exposed in the openings, thereby forming the gate insulating film 103a for the I/O transistor Tr3. Thereafter, the resist mask 120 is removed.

Figure 5A:
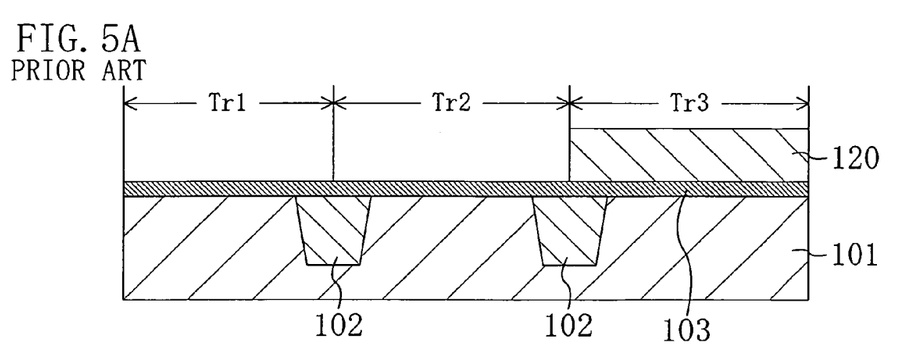
FIGS. 5A to 5E are cross-sectional views illustrating the steps of the triple-oxide process for forming a gate insulating film for the semiconductor device shown in FIG. 4.
Figure 5B:
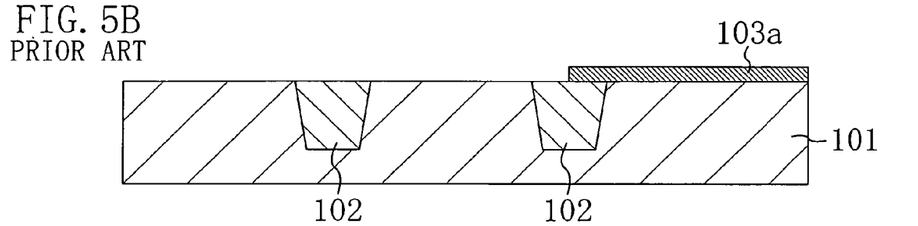
Figure 5C:
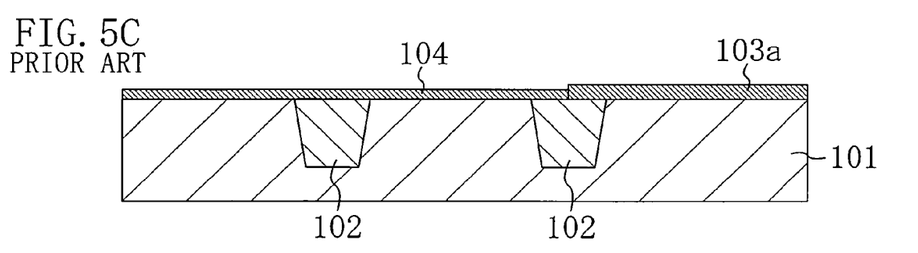
Figure 5D:
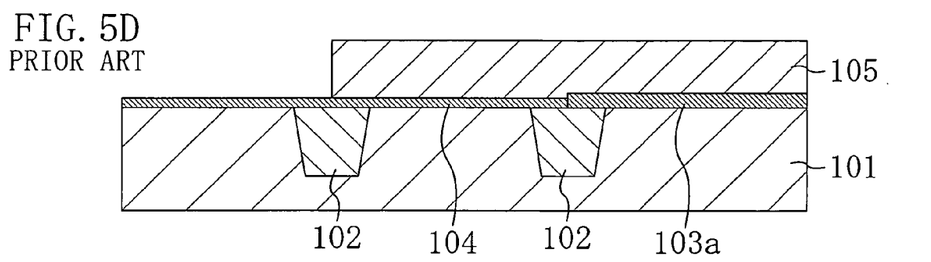
Figure 5E:
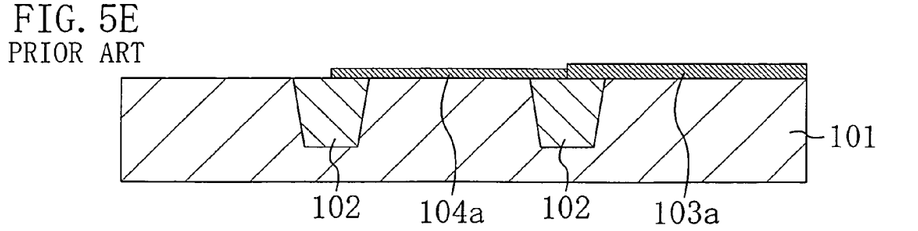

Next, in the step shown in FIG. 5C, a silicon oxide film 104 with a thickness required for the gate insulating film of the I/O transistor Tr2 is formed on the semiconductor substrate 101. Subsequently, in the step shown in FIG. 5D, a resist mask 105 for forming an opening corresponding to the region to be formed with the core transistor Tr1 is formed. Then, in the step shown in FIG. 5E, wet etching is performed to remove the portion of the silicon oxide film 104 which is exposed in the opening, thereby forming the gate insulating film 104a for the I/O transistor Tr2.

Figure 6A:
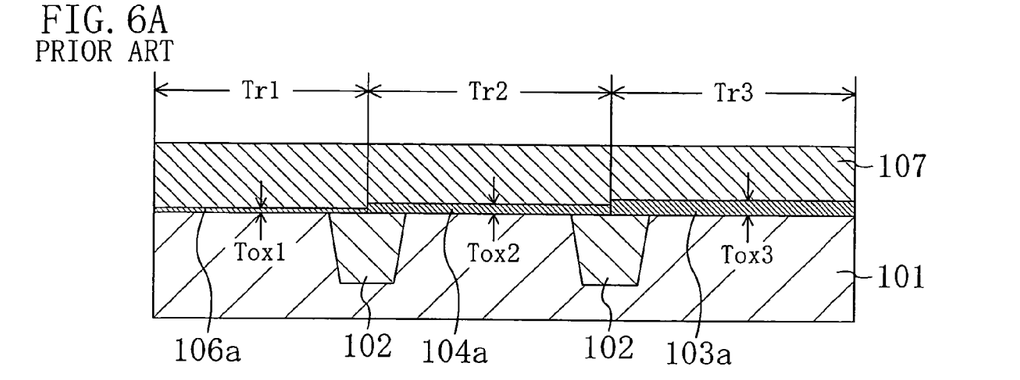
FIGS. 6A to 6D are cross-sectional views illustrating the steps of the triple-oxide process for forming the gate insulating film for the semiconductor device shown in FIG. 4.

Next, in the step shown in FIG. 6A, the gate insulating film 106a for the core transistor Tr1 is formed. Then, a polysilicon film 107 is formed over the gate insulating films 103a, 104a, and 106a.

Figure 6B:
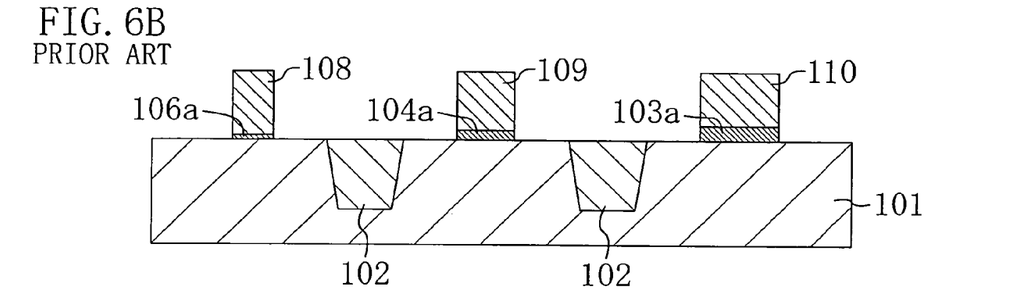

Next, in the step shown in FIG. 6B, the polysilicon film 107 is patterned to form gate electrodes 108, 109, and 110.

Figure 6C:
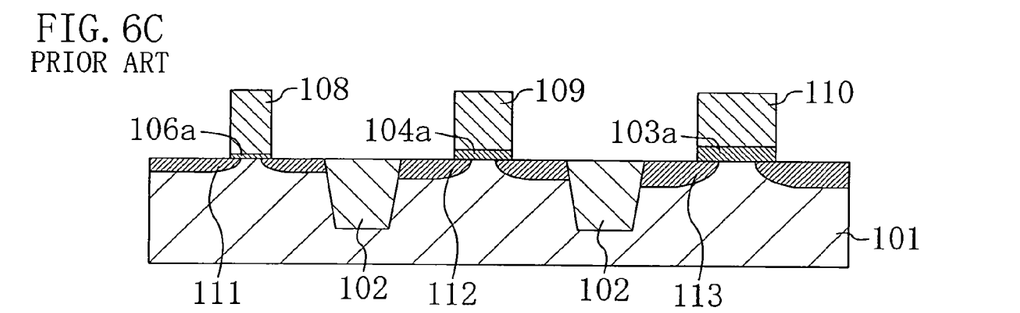

Next, in the step shown in FIG. 6C, the SD extension regions 111 and LDD regions 112 and 113 of the individual transistors Tr1 to Tr3 are formed in the step shown in FIG. 6C. Since doses and implant energies for the SD extension regions 111 and the LDD regions 112 and 113 are different from each other, the three types of regions are formed individually by different ion implantation processes. Specifically, the steps of covering, for the formation of one type of the SD extension regions 111 and the LDD regions 112 and 113, the other two types of the regions with a resist mask (not shown), implanting impurity ions in the state in which the other two types of the regions are covered with the resist mask, and then removing the resist mask are repeated three times.

Figure 6D:
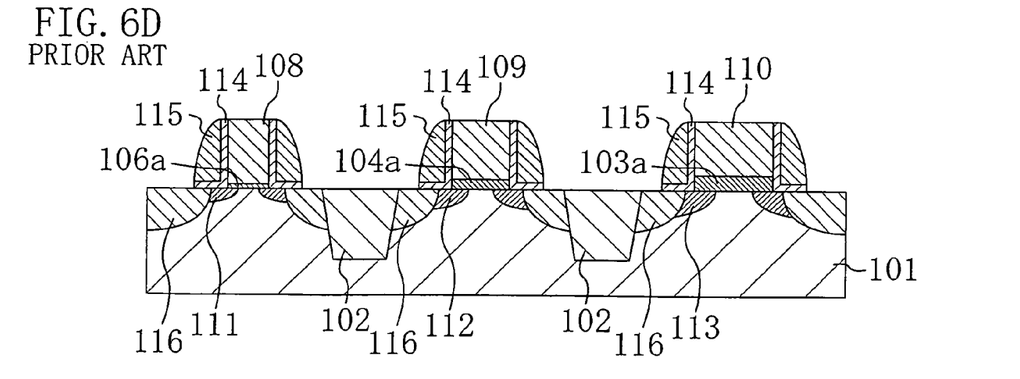

Then, in the step shown in FIG. 6D, L-shaped first sidewalls 114 are formed on the side surfaces of the gate electrodes 108, 109, and 110 and second sidewalls 115 are formed to be located on the first sidewalls 114. Thereafter, ion implantation is performed by using the gate electrodes 108, 109, and 110 and the first and second sidewalls 114 and 115 as a mask, thereby forming source/drain regions 116.

However, the triple-oxide process described above has encountered the problems of higher cost and the like resulting from complicated process steps.

SUMMARY OF THE INVENTION

It is therefore an object of the present invention to simplify a fabrication process for a semiconductor device comprising a core transistor and I/O transistors and the cost thereof, while allowing the individual transistors to retain characteristics required thereof.

A semiconductor device according to an aspect of the present invention comprises: a first insulated gate transistor composing a logic circuit; a second insulated gate transistor composing an input/output circuit and having a power source voltage higher than a power source voltage of the first insulated gate transistor; and a third insulated gate transistor composing an input/output circuit and having a power source voltage higher than that of the second insulated gate transistor, wherein a gate insulating film in the second insulated gate transistor has a thickness larger than a thickness of a gate insulating film in the first insulated gate transistor and the thickness of the gate insulating film in the second insulated gate transistor is substantially the same as a thickness of a gate insulating film in the third insulated gate transistor.

It is assumed in the specification and scope of claims of the present application that a range in which "the thicknesses of films are substantially the same" includes a range of variations occurring in the thicknesses of the films in the individual regions that have been formed under the same conditions.

It is also assumed in the specification and scope of claims of the present application that a range in which "junction depths are substantially the same" includes a range of variations observed in the final junction depths of impurity diffusion layers that have been formed under the same conditions to have different final junction depths.

A method for fabricating a semiconductor device according to an aspect of the present invention is a method for fabricating a semiconductor device comprising a first insulated gate transistor composing a logic circuit, a second insulated gate transistor composing an input/output circuit and having a power source voltage higher than a power source voltage of the first insulated gate transistor, and a third insulated gate transistor composing an input/output circuit and having a power source voltage higher than that of the second insulated gate transistor, the method comprising the steps of: (a) forming, on a semiconductor substrate, a first gate insulating film for the first insulated gate transistor; and (b) forming, on the semiconductor substrate, an insulating film including a second gate insulating film for the second insulated gate transistor and a third gate insulating film for the third insulated gate transistor and having a thickness larger than a thickness of the first gate insulating film.

DESCRIPTION OF THE PREFERRED
EMBODIMENTS

Embodiment

Figure 1:
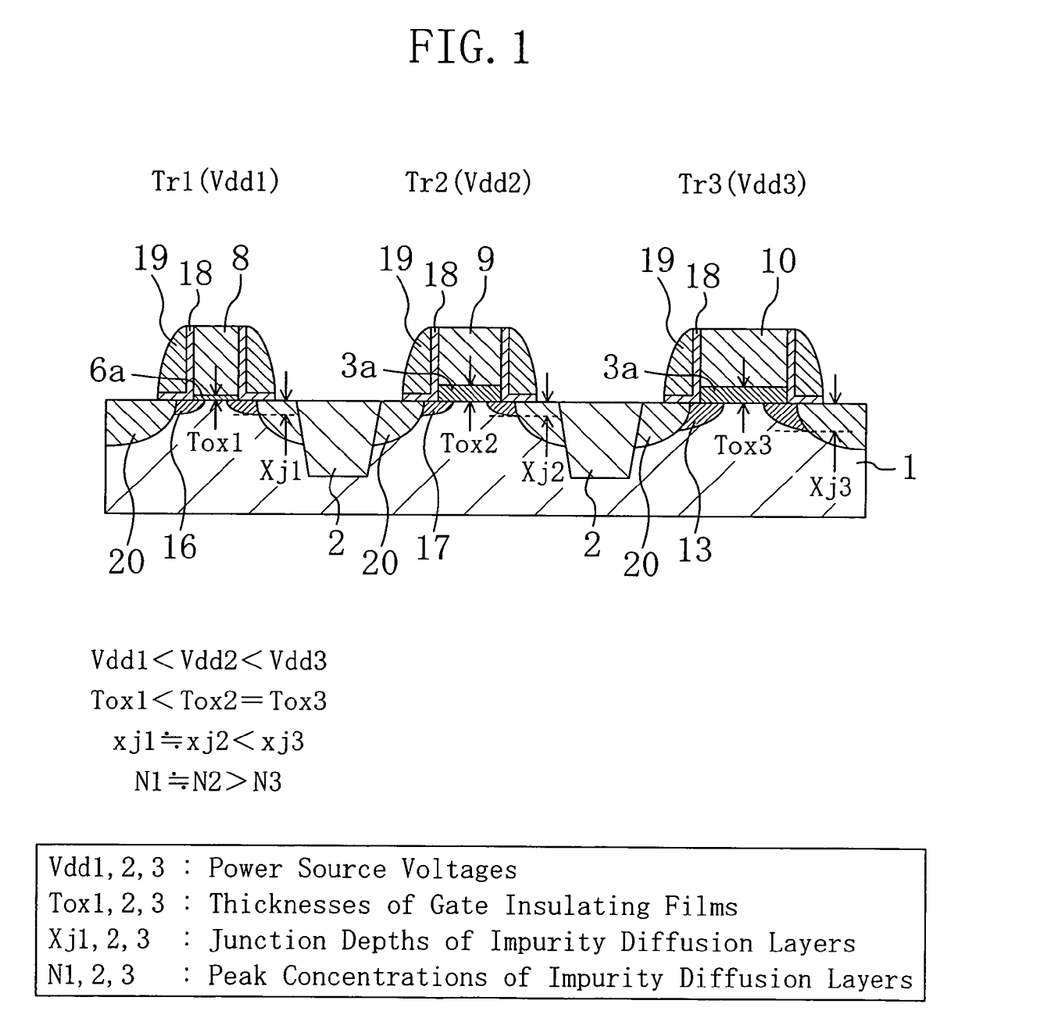
FIG. 1 is a cross-sectional view showing the structure of a semiconductor device according to an embodiment of the present invention.

Referring now to FIG. 1, a description will be given first to the structure of a semiconductor device according to an embodiment of the present invention. FIG. 1 is a cross-sectional view showing the structure of the semiconductor device according to the present embodiment.

As shown in FIG. 1, the semiconductor device according to the embodiment has: a core transistor Tr1; and two I/O transistors Tr2 and Tr3 which are different in type and power source voltage. The power source voltage Vdd1 of the core transistor Tr1, the power source voltage Vdd2 of the I/O transistor Tr2, and the power source voltage Vdd3 of the I/O transistor Tr3 satisfy Vdd1<Vdd2<Vdd3. The individual transistors Tr1 to Tr3 are provided on the regions of a semiconductor substrate 1 which are isolated by isolation regions 2.

The core transistor Tr1 has: a gate insulating film 6a provided on the semiconductor substrate 1 and having a thickness Tox1 (e.g., 2.1 nm); a gate electrode 8 provided on the gate insulating film 6a; L-shaped first sidewalls 18 provided on the side surfaces of the gate electrode 8; second sidewalls 19 provided on the first sidewalls 18; SD extension regions 16 provided in the regions of the semiconductor substrate 1 which are located under the first and second sidewalls 18 and 19 and each having a junction depth Xj1 (e.g., 30 nm) and a peak concentration N1 (e.g., $5 \times 10^{20}$ atoms/cm$^3$); and source/drain regions 20 provided in the regions of the semiconductor substrate 1 which are located externally of the SD extension regions 16.

The I/O transistor Tr2 has: a gate insulating film 3a provided on the semiconductor substrate 1 and having a thickness Tox2 (e.g., 7.6 nm); a gate electrode 9 provided on the gate insulating film 3a; the L-shaped first sidewalls 18 provided on the side surfaces of the gate electrode 9; the second sidewalls 19 provided on the first sidewalls 18; SD extension regions 17 provided in the regions of the semiconductor substrate 1 which are located under the first and second sidewalls 18 and 19 and each having a junction depth Xj2 (e.g., 30 nm) and a peak concentration N2 (e.g., $5 \times 10^{20}$ atoms/cm$^3$); and the source/drain regions 20 provided in the regions of the semiconductor substrate 1 which are located externally of the SD extension regions 17.

The I/O transistor Tr3 has: the gate insulating film 3a provided on the semiconductor substrate 1 and having a thickness Tox3 (e.g., 7.6 nm); a gate electrode 10 provided on the gate insulating film 3a; the L-shaped first sidewalls 18 provided on the side surfaces of the gate electrode 10; the second sidewalls 19 provided on the first sidewalls 18; LDD regions 13 provided in the regions of the semiconductor substrate 1 which are located under the first and second sidewalls 18 and 19 and each having a junction depth Xj3 (e.g., 60 nm) and a peak concentration N3 (e.g., $1 \times 10^{19}$ atoms/cm$^3$); and the source/drain regions 20 provided in the regions of the semiconductor substrate 1 which are located externally of the LDD regions 13.

In the semiconductor device according to the present embodiment, the thickness Tox1 of the gate insulating film 6a of the core transistor Tr1 is smaller than the thicknesses Tox2 and Tox3 of the gate insulating films 3a of the I/O transistors Tr2 and Tr3 and the thicknesses Tox2 and Tox3 of the gate insulating films 3a of the I/O transistors Tr2 and Tr3 have been adjusted to be substantially the same.

The junction depth Xj1 of each of the SD extension regions 16 of the core transistor Tr1 and the junction depth Xj2 of each of the SD extension regions 17 of the I/O transistor Tr2 have substantially the same value. On the other hand, the junction depth Xj3 of each of the LDD regions 13 of the I/O transistor Tr3 is larger than the other two junction depths Xj1 and Xj2.

The peak concentration N1 of each of the SD extension regions 16 of the core transistor Tr1 and the peak concentration N2 of each of the SD extension regions 17 of the I/O transistor Tr2 have substantially the same value. On the other hand, the peak concentration N3 of each of the LDD regions 13 of the I/O transistor Tr3 is lower than the other two peak concentrations N1 and N2.

A description will be given next to a method for fabricating the semiconductor device according to the present embodiment with reference to the drawings. FIGS. 2A to 2F and FIGS. 3A to 3D are cross-sectional views illustrating the steps of a process for fabricating the semiconductor device according to the embodiment. The description will be given herein below to a method for forming the core transistor Tr1 and the two I/O transistors Tr2 and Tr3 which are different in type and power source voltage.

Figure 2A:
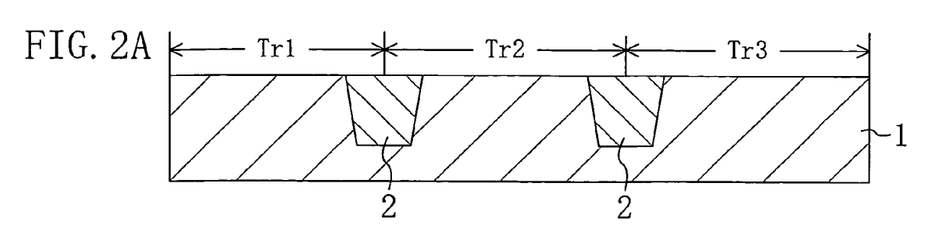
FIGS. 2A to 2F are cross-sectional views illustrating the steps of a process for fabricating the semiconductor device according to the embodiment.

In the fabrication method according to the present embodiment, the isolation regions 2 are formed first in the semiconductor substrate 1 made of silicon in the step shown in FIG. 2A.

Figure 2B:
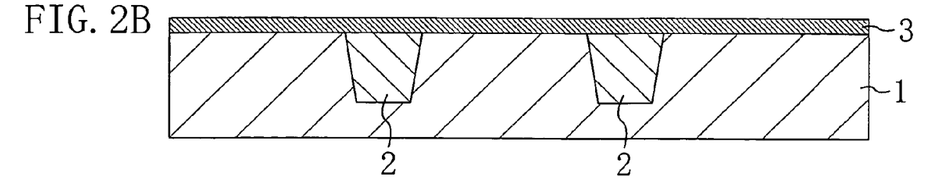
Figure 2C:
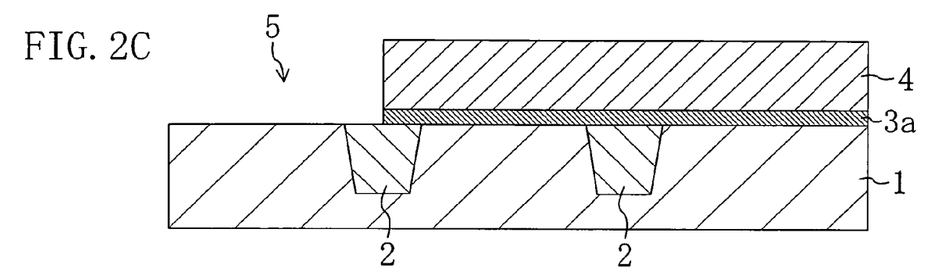

Next, in the step shown in FIG. 2B, thermal oxidation is performed to form the silicon oxide film 3 with a thickness of 7.6 nm on the semiconductor substrate 1. Then, in the step shown in FIG. 2C, a photolithographic process is performed to form a photoresist 4 on the semiconductor substrate 1. Thereafter, the portion of the photoresist 4 which is located in the region to be formed with the core transistor Tr1 is removed so that an opening 5 is formed in the photoresist 4. Then, wet etching is performed with respect to the silicon oxide film 3 by using the photoresist 4 as a mask to remove the portion of the silicon oxide film 3 which is exposed in the opening 5, thereby forming the gate insulating film 3a on the regions of the semiconductor substrate 1 to be formed with the I/O transistors Tr2 and Tr3.

Figure 2D:
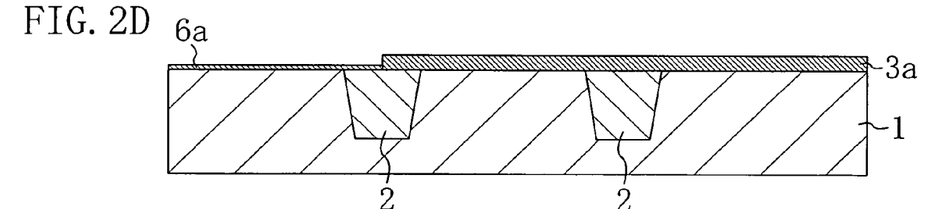
Figure 2E:
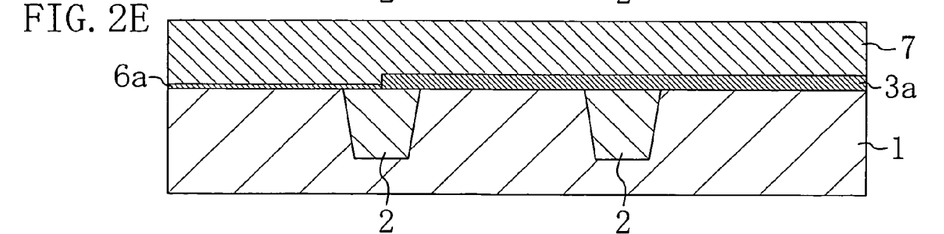

Next, in the step shown in FIG. 2D, thermal oxidation is performed with respect to the semiconductor substrate 1 to form the gate insulating film 6a with a thickness of 2.1 nm on the region of the semiconductor substrate 1 to be formed with the core transistor Tr1. Then, in the step shown in FIG. 2E, a polysilicon film 7 with a thickness of 140 nm is deposited over the gate insulating films 3a and 6a. Alternatively, gate implantation for suppressing gate depletion may also be performed with respect to the polysilicon film 7, though the depiction thereof is omitted.

Figure 2F:
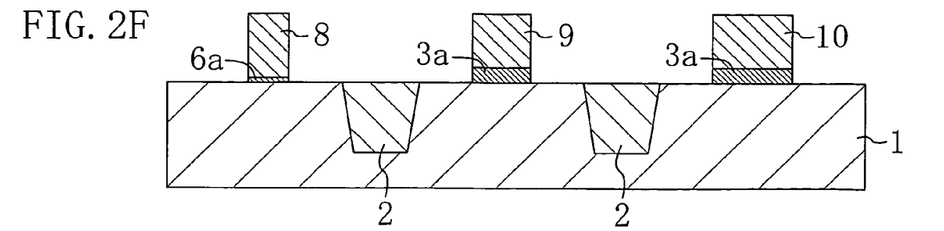

Next, in the step shown in FIG. 2F, a photolithographic process is performed to form a photoresist (not shown) configured to pattern the polysilicon film 7 into the gate electrodes on the polysilicon film 7. Subsequently, dry etching using the photoresist as a mask is performed with respect to the polysilicon film 7, thereby forming the gate electrodes 8, 9, and 10 in the regions to be formed with the transistors Tr1 to Tr3. By the dry etching process, the portions of the gate insulating films 3a and 6a other than the portions thereof located under the gate electrodes 8, 9, 10 may be either removed or left.

Figure 3A:
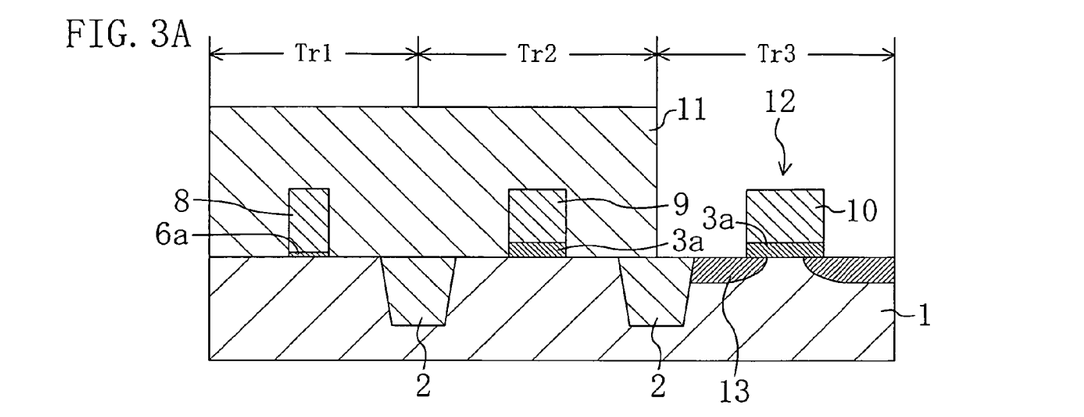
FIGS. 3A to 3D are cross-sectional views illustrating the steps of the process for fabricating the semiconductor device according to the embodiment.

Next, in the step shown in FIG. 3A, a photoresist 11 is formed on the semiconductor substrate 1 to cover the gate electrodes 8, 9, and 10. Then, the portion of the photoresist 11 which is located in the region to be formed with the I/O transistor Tr3 is removed so that an opening 12 is formed in the photoresist 11. In this state, the implantation of As ions in the semiconductor substrate 1 is performed under conditions such that an implant energy is 45 KeV and a dose is $3 \times 10^{13}$ ions/cm$^2$, thereby forming the LDD regions 13 each having a junction depth of 60 nm in the portions of the semiconductor substrate 1 which are located externally of the gate electrode 10. Thereafter, the photoresist 11 is removed.

Figure 3B:
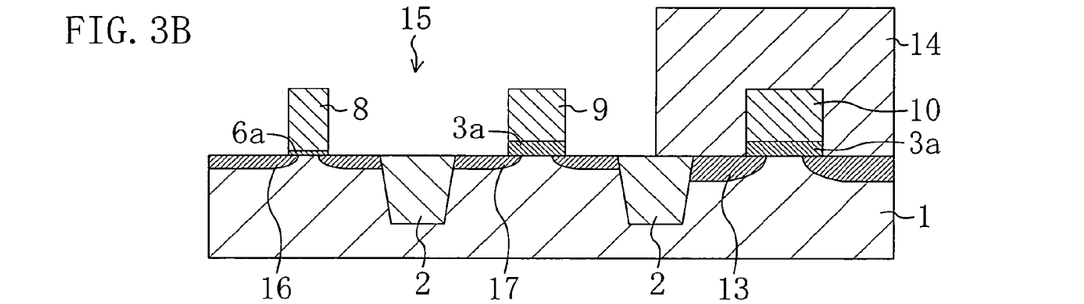

Next, in the step shown in FIG. 3B, a photoresist 14 is formed on the semiconductor substrate 1 to cover the gate electrodes 8, 9, and 10. Then, the portions of the photoresist 14 which are covering the regions to be formed with the core transistor Tr1 and the I/O transistor Tr2 are removed so that openings 15 are formed in the photoresist 14. In this state, the implantation of As ions in the semiconductor substrate 1 is performed under conditions such that an implant energy is 3 KeV and a dose is $1 \times 10^{15}$ ions/cm$^2$, thereby forming the SD extension regions 16 each having a junction depth of 30 nm in the portions of the semiconductor substrate 1 which are located externally of the gate electrode 8, while forming the SD extension regions 17 each having a junction depth of 30 nm in the portions of the semiconductor substrate 1 which are located externally of the gate electrode 9. Thereafter, the photoresist 14 is removed.

At the time of performing the ion implantation shown in FIG. 3B, the thickness Tox1 of the gate insulating film 6a of the core transistor Tr1 is different from the thickness Tox2 of the gate insulating film 3a of the I/O transistor Tr2. When the SD extension regions 16 and 17 are formed with the gate insulating films 6a and 3a remaining on the semiconductor substrate 1, a difference corresponding to the difference between the respective thicknesses of the gate insulating films 3a and 6a is produced between the respective junction depths of the SD extension regions 16 and 17. In addition, a thermal process performed in the other region after the step shown in FIG. 3B also exert different influences on the SD extension regions 16 and 17. This leads to the possibility that, even though the SD extension regions 16 and 17 are formed under the same conditions, the respective final junction depths thereof may be different from each other. It is assumed that the difference between the respective junctions depths of the SD extension regions 16 and 17, which is observed in such a case, is included in "substantially the same" range.

Figure 3C:
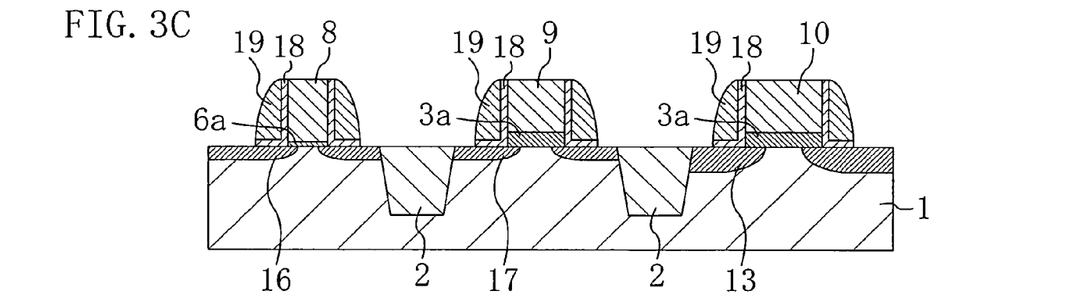

Next, in the step shown in FIG. 3C, an oxide film (not shown) with a thickness of 10 nm and a nitride film (not shown) with a thickness of 40 nm are formed on the semiconductor substrate 1 to cover the gate electrodes 8, 9, and 10. Then, anisotropic dry etching is performed, thereby forming the L-shaped first sidewalls 18 on the side surfaces of the gate electrodes 8, 9, and 10 and the second sidewalls 19 covering the first sidewalls 18.

Figure 3D:
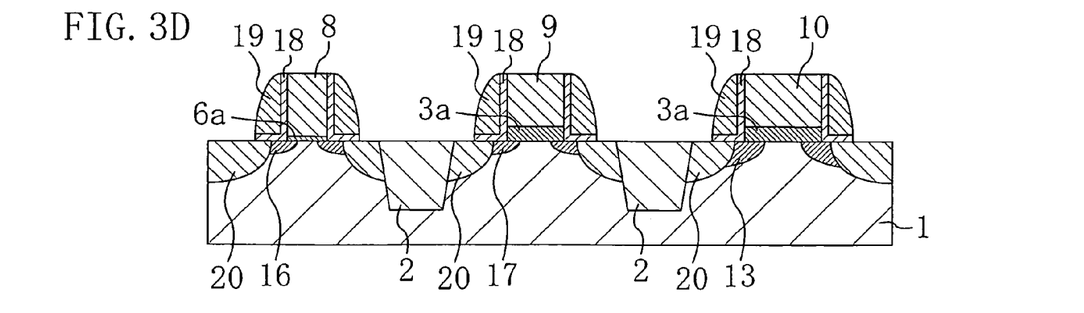

Next, in the step shown in FIG. 3D, the implantation of As ions is performed under conditions such that an implant energy is 30 KeV and a dose is $4 \times 10^{15}$ ions/cm$^2$, thereby forming the source/drain regions 20 in the portions of the semiconductor substrate 1 which are located externally of the sidewalls 18 and 19. Thereafter, a thermal process for impurity activation and a wiring step are performed, though the depiction and description thereof will be omitted, whereby the semiconductor device according to the present embodiment is formed.

In the present embodiment, the gate insulating film 3a of the I/O transistor Tr2 and the gate insulating film 3a of the I/O transistor Tr3 are formed in the same step, while the SD extension regions 17 of the I/O transistor Tr2 are formed in the same step as the SD extension regions 16 of the core transistor Tr1. This allows the process for forming the gate insulating films and the SD extension regions to be further simplified than in the conventional embodiment and also achieves a cost reduction.

Since the gate insulating film 3a of the I/O transistor Tr2 has been formed to have the same thickness as the gate insulating film 3a of the I/O transistor Tr3, the gate insulating film 3a of the I/O transistor Tr2 is thicker than in the conventional embodiment. In general, if the thickness of a gate insulating film is increased, a driving force is lowered and a short-channel effect is more likely to occur. However, such a problem can be circumvented in the present embodiment by controlling the conditions for the SD extension regions 17. Specifically, the problem described above can be circumvented by forming the SD extension regions 17 under the same conditions as used in forming the SD extension regions 16, reducing the junction depth of each of the SD extension regions 17 of the I/O transistor Tr2, and increasing the peak concentration thereof.

OTHER EMBODIMENTS

Although the foregoing embodiment has described the case where each of the gate insulating films 3a and 6a is a silicon oxide film, the present invention may also use a silicon oxynitride film, a nitride film, or a high dielectric film ($HfO_x$ or the like) as each of the gate insulating films 3a and 6a. The present invention may also use a multilayer film consisting of any two or more of these films. In the case of using an oxynitride film as each of the gate insulating films 3a and 6a, the oxynitride film may be formed by thermally oxidizing the surface of the semiconductor substrate 1, while supplying nitrogen. Alternatively, the oxynitride film may also be formed by thermally oxidizing the surface of the semiconductor substrate 1 to form an oxide film, performing a plasma nitridation process, and then introducing nitrogen into the oxide film. In the case of using a nitride film or a high dielectric film as each of the gate insulating films 3a and 6a, either of these films may be formed appropriately on the semiconductor substrate 1 by using a CVD technology.

Although the foregoing embodiment has described the case where each of the gate electrodes 8, 9, and 10 is composed of a polysilicon film, the present invention may also use an amorphous silicon film, a germanium-containing polysilicon film, a germanium-containing amorphous silicon film, or the like as each of the gate electrodes 8, 9, and 10.

Although the foregoing embodiment has described the case where the SD extension regions 16 and 17 are formed in the step shown in FIG. 3C after forming the LDD regions 13 in the step shown in FIG. 3B, the present invention may also reverse the order in which these steps are performed.

In the embodiment described above, the thinner gate insulating film 6a is formed in the step shown in FIG. 2D after forming the thicker gate insulating film 3a in the step shown in FIG. 2B. This is because the method adopted in the embodiment has the advantage of enabling more precise control of the values of the film thicknesses. However, the present invention may also reverse the order in which these steps are performed.

What is claimed is:

1. A semiconductor device comprising:
   a first insulated gate transistor;
   a second insulated gate transistor having a power source voltage higher than a power source voltage of the first insulated gate transistor; and
   a third insulated gate transistor having a power source voltage higher than a power source voltage of the second insulated gate transistor, wherein
   the first insulated gate transistor has a first gate insulating film formed on a first region of a semiconductor substrate of a first conductivity type, a first gate electrode formed on the first gate insulating film, first extension regions of a second conductivity type formed in parts of the first region of the semiconductor substrate which are located in both sides of the first gate electrode, and first source/drain regions of a second conductivity type provided in regions of the first region of the semiconductor substrate which are located externally of the first extension regions,
   the second insulated gate transistor has a second gate insulating film formed on a second region of the semiconductor substrate, a second gate electrode formed on the second gate insulating film, second extension regions of a second conductivity type formed in parts of the second region of the semiconductor substrate which are located in both sides of the second gate electrode, and second source/drain regions of a second conductivity type provided in regions of the second region of the semiconductor substrate which are located externally of the second extension regions,
   the third insulated gate transistor has a third gate insulating film formed on a third region of the semiconductor substrate, a third gate electrode formed on the third gate insulating film, LDD regions of a second conductivity type formed in parts of the third region of the semiconductor substrate which are located in both sides of the third gate electrode, and third source/drain regions of a second conductivity type provided in regions of the third region of the semiconductor substrate which are located externally of the LDD regions,
   a thickness of the second gate insulating film is larger than a thickness of the first gate insulating film and substantially the same as the thickness of the third gate insulating film,
   the deepest junction depth of the second extension regions measured from the surface of the semiconductor substrate is smaller than the deepest junction depth of the LDD regions measured from the surface of the semiconductor substrate, and substantially the same as the deepest junction depth of the first extension regions measured from the surface of the semiconductor substrate,
   a peak concentration of the second extension regions is higher than a peak concentration of the LDD regions and substantially the same as a peak concentration of the first extension regions, and
   the first region, the second region and the third region are isolated by isolation regions provided in the semiconductor substrate.

2. The semiconductor device of claim 1, wherein L-shaped first sidewalls are formed on both side surfaces of each of the first, second and third gate electrodes, and a second sidewall is formed on each of the L-shaped first sidewalls.

3. The semiconductor device of claim 1, wherein the first gate insulating film, the second gate insulating film, or the third gate insulating film includes a silicon oxide film or a silicon oxynitride film.

4. The semiconductor device of claim 1, wherein the first gate insulating film, the second gate insulating film, or the third gate insulating film includes a silicon nitride film or a high dielectric film.

5. The semiconductor device of claim 1, wherein the first insulated gate transistor is a core transistor and the second insulated gate transistor and the third insulated gate transistor are I/O transistors which are different in type and power source voltage.

* * * * *